US006472797B1

(12) United States Patent
Kishimoto

(10) Patent No.: US 6,472,797 B1
(45) Date of Patent: Oct. 29, 2002

(54) PIEZOELECTRIC ELECTRO-ACOUSTIC TRANSDUCER

(75) Inventor: Takeshi Kishimoto, Toyama-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/631,038

(22) Filed: Aug. 1, 2000

(30) Foreign Application Priority Data

Aug. 10, 1999 (JP) ........................................ 11-226099
Jun. 29, 2000 (JP) .................................... 2000-195606

(51) Int. Cl.[7] ............................................ H01L 41/04
(52) U.S. Cl. .................................... 310/324; 310/348
(58) Field of Search ............................ 310/348, 324, 310/353, 321

(56) References Cited

U.S. PATENT DOCUMENTS 4,471,258 A * 9/1984 Kumada ..................... 310/345
4,947,075 A * 8/1990 Maury et al. ............... 310/324
4,965,483 A * 10/1990 Abe et al. ................... 310/324
5,371,428 A * 12/1994 Kikuchi et al. ............. 310/324
5,955,821 A * 9/1999 Yamamoto et al. ......... 310/324
6,045,642 A * 4/2000 Takeuchi et al. .......... 156/89.11
2001/0004180 A1 * 6/2001 Kishimoto .................. 310/348

* cited by examiner

*Primary Examiner*—Nestor Ramirez
*Assistant Examiner*—Peter Medley
(74) *Attorney, Agent, or Firm*—Keating & Bennett, LLP

(57) ABSTRACT

A piezoelectric electro-acoustic transducer is constructed such that adherence of a piezoelectric diaphragm to a casing is easily performed, a sufficient supporting strength is achieved, and the piezoelectric diaphragm is supported while hindrance of vibration thereof is minimized. This piezoelectric electro-acoustic transducer includes a piezoelectric diaphragm constructed by adhering a piezoelectric ceramic plate having front and back surfaces including electrodes, onto a metallic plate, and a case in which the piezoelectric diaphragm is accommodated by fixing the peripheral portion thereof with an elastic adhesive. Support portions for supporting the peripheral portion of the piezoelectric diaphragm are provided in the case, and a supporting surface having an arcuate cross-section is provided on the supporting portions so that a center of curvature of the supporting surface is positioned near a lower surface of the peripheral portion of the piezoelectric diaphragm.

19 Claims, 8 Drawing Sheets

PIEZOELECTRIC ELECTRO-ACOUSTIC TRANSDUCER

BACKGROUND OF THE INVENTION

1. Field of the Invention The present invention relates to a piezoelectric electro-acoustic transducer such as a piezoelectric sounder, a piezoelectric speaker, a piezoelectric buzzer, and a piezoelectric receiver.

2. Description of the Related Art

Conventional piezoelectric electro-acoustic transducers have been widely used for piezoelectric buzzers and piezoelectric speakers. Typically, such a piezoelectric electro-acoustic transducer has a structure in which a unimorph diaphragm is constructed by adhering a circular metallic plate onto one surface of a circular piezoelectric ceramic plate, the peripheral portion of the unimorph diaphragm is supported in a circular case, and the opening of the case is closed by a cover. The unimorph diaphragm exhibits bending oscillations by adhering a ceramic plate having an outside diameter that expands and contracts by applying a voltage, to a metallic plate that does not change in size.

Conventional piezoelectric electro-acoustic transducers described above typically use three kinds of supporting structures for supporting the diaphragm in the case. These three kinds of support structures are illustrated in FIGS. 1 to 3. FIG. 1 shows a supporting structure arranged such that a back-surface node portion of a diaphragm 1 is fixed by a silicon adhesive 3 to a supporting portion 2*a* which projects from a case 2. A cover 4 is provided for closing the opening of the case 2. FIG. 2 shows a supporting structure arranged such that the peripheral portion of the diaphragm 1 is fixed to a supporting portion 2*b* of the case 2 by the silicon adhesive 3. FIG. 3 shows a supporting structure wherein tapered groove portions 2*c* and 4*a* are located where the case 2 and the cover 4 meet, and the peripheral portion of the diaphragm 1 is inserted into the groove portions 2*c* and 4*a* and is fixed by the adhesive 3.

With the supporting structure using the node portion as shown in FIG. 1, since it is necessary to fix the back surface of the diaphragm 1 to the supporting portion 2*a* by the adhesive 3, there are drawbacks in that the adhering process is difficult and a large quantity of the adhesive 3 cannot be supplied between the supporting portion 2*a* and the diaphragm 1. Thus, the supporting strength of the diaphragm 1 is not sufficient.

With the supporting structure using the peripheral portion as shown in FIG. 2, the adhering process is easy but the supporting portion 2*b* of the case 2 has a flat surface and, therefore, the back surface of the diaphragm 1 is closely adhered to the surface of the supporting portion 2*b*, thereby restricting an angular change of the diaphragm 1. Accordingly, there is a drawback in that an effective diameter $d_1$ of the diaphragm 1 is much smaller than the actual diameter $d_0$ of the diaphragm 1 and actuation of the diaphragm at low frequencies is difficult.

With the supporting structure using the tapered groove as shown in FIG. 3, the diaphragm 1 is obliquely arranged. If the diaphragm 1 deviates from the center of the case 2 when assembling the diaphragm 1 into the case 2, the diaphragm 1 might be damaged if the cover 4 is forcibly fitted. The liquid adhesive 3 must be injected in the tapered groove portions 2*c* and 4*a* by utilizing a dispenser after assembling the case 2 and the cover 4 and, then, there is a drawback that the method of applying the adhesive 3 is difficult, thus increasing costs.

SUMMARY OF THE INVENTION

To overcome the problems described above, preferred embodiments of the present invention provide a piezoelectric electro-acoustic transducer in which adherence of a piezoelectric diaphragm to a casing is simply performed, a sufficient supporting strength is achieved, and the piezoelectric diaphragm is supported while minimizing hindrance of vibration of the piezoelectric diaphragm.

According to one preferred embodiment of the present invention, a piezoelectric electro-acoustic transducer includes a piezoelectric diaphragm having a piezoelectric ceramic plate, and a metallic plate onto which the piezoelectric ceramic plate is adhered, and a casing containing the piezoelectric diaphragm, the casing including a supporting portion arranged to support a peripheral portion of the piezoelectric diaphragm by fixing the peripheral portion thereof with an elastic adhesive, and a supporting surface provided on the supporting portion, the supporting surface having an substantially arcuate cross-section and a center of curvature of the supporting surface being positioned near a lower surface of the peripheral portion of the piezoelectric diaphragm.

When an alternating voltage is applied between electrodes of the piezoelectric diaphragm, the piezoelectric diaphragm is bent and vibrated as the piezoelectric ceramic plate expands/contracts. Although the peripheral portion of the piezoelectric diaphragm is fixed to the supporting portion of the casing by the elastic adhesive, the supporting surface (curved surface) with the substantially arcuate cross-section is provided on the supporting portion of the casing so that the center of curvature is positioned near the lower surface of the periphery of the piezoelectric diaphragm and, therefore, the piezoelectric diaphragm is supported in a substantially tangential direction of the curved surface. As the supporting surface approaches the approximate center portion of the piezoelectric diaphragm from the peripheral portion thereof, an opposing distance between the curved surface as the supporting surface and the piezoelectric diaphragm becomes larger. Therefore, an angular change is not limited when the piezoelectric diaphragm oscillates. Thus, the effective diameter of the piezoelectric diaphragm is increased and a low-frequency is achieved. When setting the piezoelectric diaphragm to the supporting portion of the casing, if the setting portion is slightly deviated in the lateral direction, the oblique disposition of the piezoelectric diaphragm is easily controlled by placing the peripheral portion of the piezoelectric diaphragm on the curved surface. Further, when fixing the piezoelectric diaphragm to the supporting portion of the casing, the peripheral portion of the piezoelectric diaphragm may be set to the supporting portion and the surface thereof may be coated with an adhesive, thus greatly simplifying the adhering process.

Preferably, the radius of curvature of the substantially arcuate supporting surface is smaller than a long surface or diameter of the piezoelectric diaphragm, because, if the radius of curvature is larger than the long surface or diameter of the piezoelectric diaphragm, vibration is easily obstructed at the peripheral portion of the piezoelectric diaphragm but also at an inner portion of the peripheral portion, which decreases the vibration area of the piezoelectric diaphragm.

By making the radius of curvature of the supporting surface smaller than a long surface or a diameter of the piezoelectric diaphragm, the vibration area of the piezoelectric diaphragm is greatly increased.

According to another preferred embodiment of the present invention, electrodes are disposed on front and back surfaces of the piezoelectric ceramic plate and a metallic plate is attached to the electrode of one surface of the piezoelectric ceramic plate to define a piezoelectric diaphragm having a unimorph configuration. As a result of this construction, the piezoelectric diaphragm is oscillated in a bending mode by applying an alternating signal between the electrode on the other surface of the piezoelectric ceramic diaphragm and the metallic plate.

The piezoelectric diaphragm may be constructed by adhering a substantially rectangular piezoelectric ceramic plate to a substantially rectangular metallic plate. In this case, two short surfaces of the metallic plate are attached to the supporting portion of the casing by an elastic adhesive and a space between two long surfaces of the metallic plate and the casing is sealed by an elastic sealing material.

That is, if utilizing a circular diaphragm, only the center thereof becomes a maximum amplitude point and, therefore, the displacement volume is small and the acoustic transducing efficiency is relatively low. Since the peripheral surface of the diaphragm are restricted, the frequency is increased and the radial size must be increased to obtain a diaphragm having a low frequency.

On the other hand, if a substantially rectangular diaphragm is used, a maximum amplitude point exists along a central line in the longitudinal direction of the substantially rectangular diaphragm and, therefore, the displacement volume is very large and a high acoustic transducing efficiency is achieved. Although the two short surfaces of the piezoelectric diaphragm are restricted, the two long surfaces are displaced freely. Thus, a lower frequency is achieved with the substantially rectangular diaphragm as compared with the substantially circular diaphragm. With the above-mentioned piezoelectric electro-acoustic transducer using the substantially rectangular diaphragm, the displacement of the diaphragm is greatly increased. As a consequence, the novel structure and arrangement of preferred embodiments of the present invention achieve a further improvement in sound pressure and realizing a low frequency.

When the piezoelectric diaphragm includes a laminated body in which two or three piezoelectric layers are laminated, main surface electrodes are provided on front and back surfaces of the laminated body, internal electrodes are located between each of the ceramic layers, all of the ceramic layers are polarized in the same direction along the thickness direction. By applying the alternating signal between the main surface electrodes and the internal electrodes, the laminated body is oscillated in a bending mode, because the ceramic layers in the back surface is contracted when the ceramic layers in the front surface is expanded. This displacement becomes larger than the unimorph diaphragm, thereby increasing the sound pressure.

Further, it is preferable that the laminated body has a substantially rectangular shape, two short surfaces of the laminated body are attached to the supporting portions of the casing by an elastic adhesive, and spaces between the two surfaces of the laminated body and the casing are sealed with an elastic sealing material. In such a case, as in one of the preferred embodiments of the present invention, lower frequencies are achieved as compared to a circular diaphragm. Also, the displacement is increased, thereby improving the sound pressure.

Other features, elements, characteristics and advantages of the present invention will become apparent from the following detailed description of preferred embodiments with reference to the attached drawings.

DETAILED DESCRIPTION OF PREFERRED EMBODIMENTS

Figure 1:
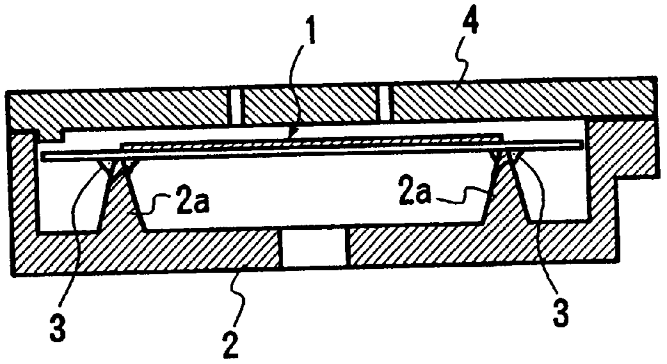
Fig. 1 PRIOR ART
FIG. 1 is a cross-sectional view of one example of a conventional piezoelectric electro-acoustic transducer.
Figure 2:
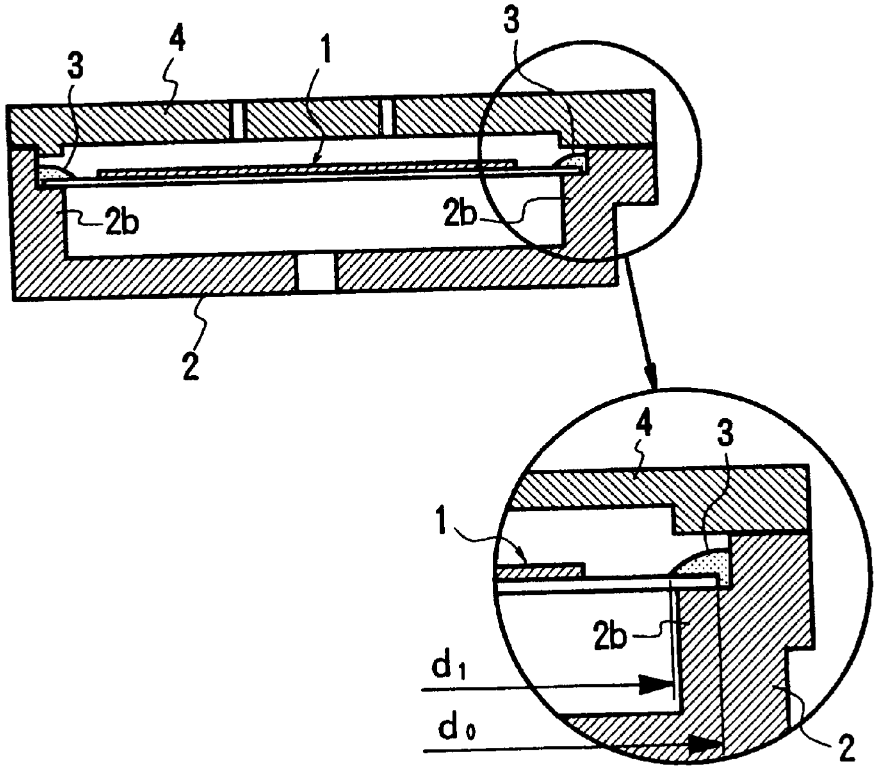
Fig. 2 PRIOR ART
FIG. 2 is a cross-sectional view of another example of the conventional piezoelectric electro-acoustic transducer.
Figure 3:
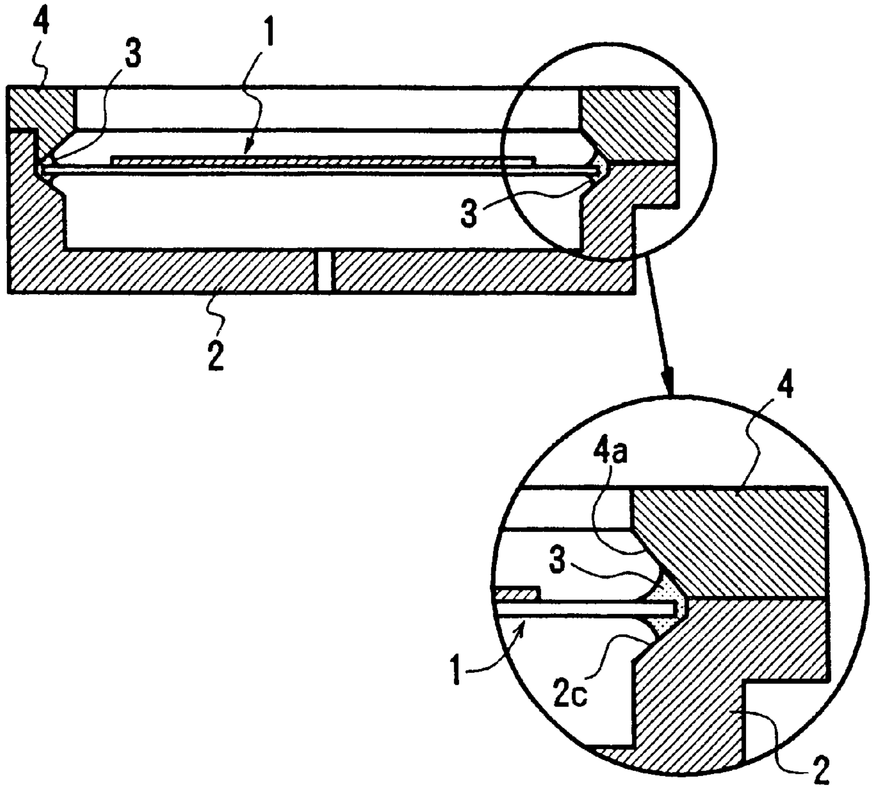
Fig. 3 PRIOR ART
FIG. 3 is a cross-sectional view of still another example of the conventional piezoelectric electro-acoustic transducer.
Figure 4:
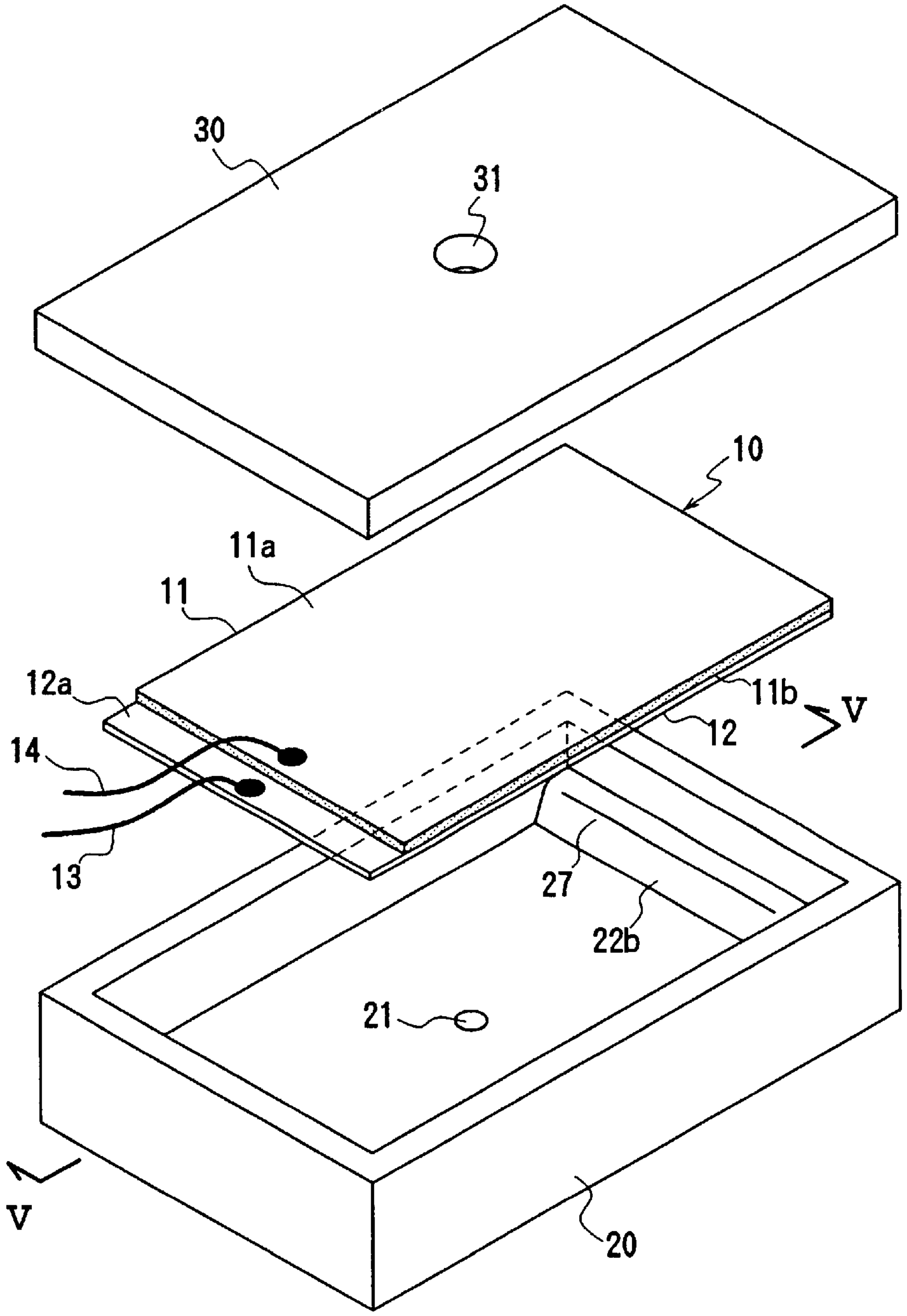
FIG. 4 is an exploded perspective view of a first preferred embodiment of a piezoelectric electro-acoustic transducer according to the present invention.
Figure 5:
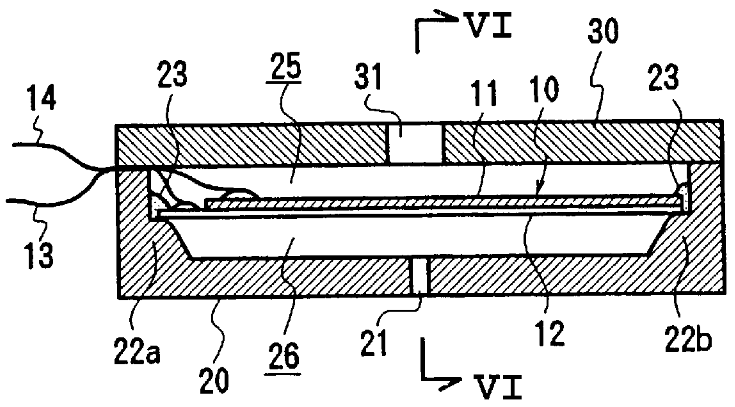
FIG. 5 is a cross-sectional view along a line V—V in FIG. 4 showing an assembled state of the piezoelectric electro-acoustic transducer.
Figure 6:
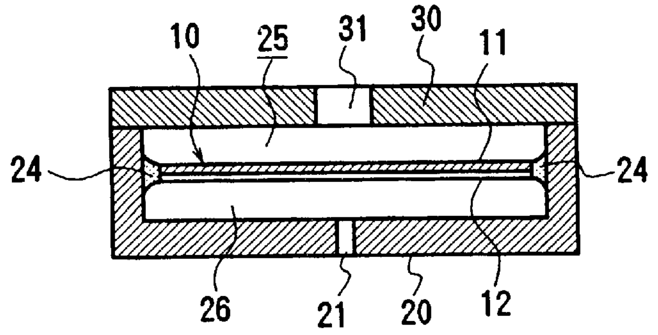
FIG. 6 is a cross-sectional view along a line VI—VI shown in FIG. 5.

FIGS. 4 to 6 show a first preferred embodiment of a piezoelectric electro-acoustic transducer according to the present invention.

The piezoelectric electro-acoustic transducer preferably includes a unimorph piezoelectric diaphragm 10 having a substantially rectangular shape, and a case 20 and a cover 30 which accommodate the piezoelectric diaphragm 10 and are preferably made of a resin. The case 20 and the cover 30 define a casing.

As shown in FIG. 4, the piezoelectric diaphragm 10 according to this preferred embodiment is preferably constructed by adhering a substantially rectangular piezoelectric ceramic plate 11 to the surface of a substantially rectangular metallic plate 12. The piezoelectric ceramic plate 11 has electrodes 11*a* and 11*b* on the front and back surfaces thereof, respectively, and is polarized in the thickness direction. The metallic plate 12 preferably has a substantially rectangular shape with a width that is substantially the same as that of the piezoelectric ceramic plate 11 and a length that is slightly longer than that of the piezoelectric ceramic plate 11, and is electrically connected to the back-surface electrode 11*b* of the piezoelectric plate 11. For the metallic plate 12, it is preferable to use a material having an excellent conductivity and spring elasticity. In particular, the Young's modulus is preferably close to that of the piezoelectric ceramic plate 11. Thus, the metallic plate 12 is preferably made of phosphor bronze, 42Ni, or other suitable materials. Incidentally, if the metallic plate 12 is made of 42Ni, the coefficient of thermal expansion is close to that of ceramic (such as PZT) and, then, higher reliability of the metallic plate 12 is achieved. According to this preferred embodiment, the piezoelectric ceramic plate 11 is adhered to one surface at a position that is deviated in the length direction of the metallic plate 12, and the metallic plate 12 has an exposed portion 12*a* that is defined by exposing the metallic plate 12 at the other surface in the length direction thereof.

One or a plurality of sounding holes 21 are formed in a bottom wall portion of the case 20, and the cover 30 is adhered to the opening at the upper surface of the case 20. One or a plurality of sounding holes 31 are formed in the cover 30. Step-like supporting portions 22*a* and 22*b* are disposed at inside surfaces of the two short surfaces of the case 20 that face each other. The piezoelectric diaphragm 10 is placed on the supporting portions 22*a* and 22*b* so that the metallic plate 12 faces downward. The two short surfaces of the metallic plate 12 are fixed by an elastic adhesive 23 such as a silicon adhesive. Spaces between the two long surfaces of the piezoelectric diaphragm 10 and the case 20 are sealed by an elastic sealing material 24. As a result, acoustic spaces 25 and 26 are defined at the front and back surfaces of the piezoelectric diaphragm 10.

Lead wires 13 and 14 are connected to the exposed portion 12*a* of the metallic plate 12 and the front surface electrode 11*a* of the piezoelectric ceramic plate 11, respectively, by soldering or other suitable method, and are guided through a space between the case 20 and the cover 30 to the outside. When an alternating voltage is applied across the lead wires 13 and 14, the piezoelectric diaphragm 10 is bent and oscillated in a longitudinal bending mode by setting both end portions in the length direction of the piezoelectric diaphragm 10 at the supporting portions. The bending oscillation causes the acoustic spaces 25 and 26 at the front and back surfaces to resonate, thereby emitting sound from the sounding holes 21 and 31.

Figure 7:
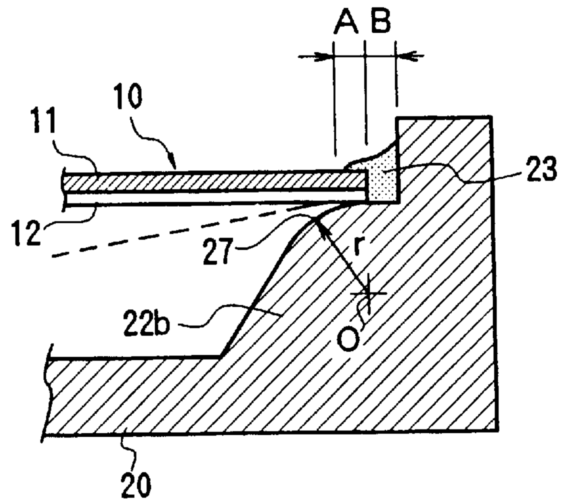
FIG. 7 is an enlarged cross-sectional view of a portion of the piezoelectric electro-acoustic transducer shown in FIG. 5.

FIG. 7 shows the supporting portion 22*b* as one supporting portion of the case 20 in detail. Note that the supporting portion 22*a* defining the other supporting portion of the case 20 preferably has substantially the same structure as that of the supporting portion 22*b* and the description thereof is thus omitted.

A supporting surface 27 having a substantially arcuate cross-section at a top portion of the supporting portion 22*b* so that a center of curvature O of the supporting surface 27 is positioned near the lower surface of the periphery of the piezoelectric diaphragm 10. Referring to FIG. 7, reference symbol A denotes a supporting width (coating width of an adhesive with which the diaphragm is coated), and reference symbol B denotes a clearance between the case 20 and the piezoelectric diaphragm 10.

Preferably, a radius of curvature r of the supporting surface 27 is set according to the following relational expression.

$$\sin^{-1}\left(\frac{A}{r}\right) \geqq \tan^{-1}\left[\frac{\text{displacement of 1 mm inside from diaphragm end}}{(1-A)_{\text{mm}} \text{ from diaphragm end}}\right] \quad (1)$$

If r is in the approximate range of 0.3 mm≦r≦1.0 mm, a suitable result, in terms of the oscillation characteristics and support, is achieved.

Figure 8:
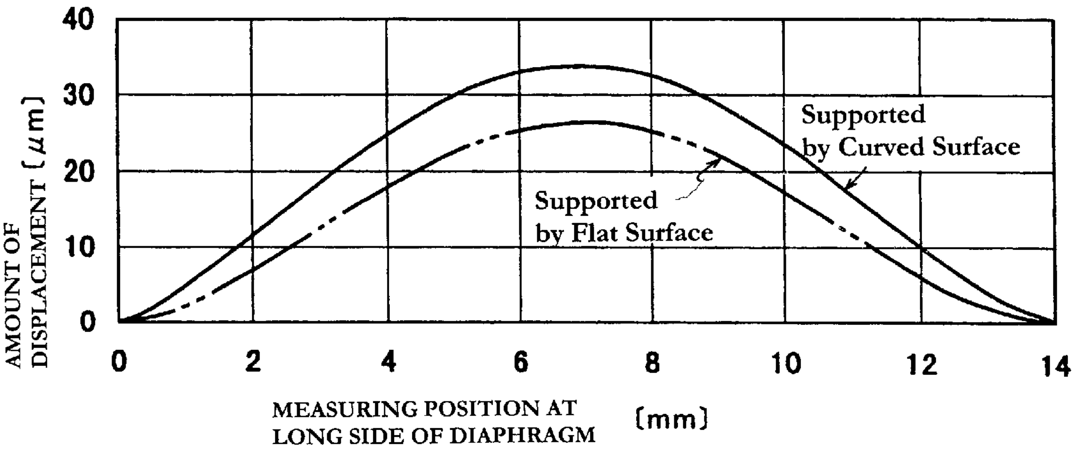
FIG. 8 is a diagram showing the displacement of a substantially rectangular diaphragm.

FIG. 8 shows the displacement of a substantially rectangular piezoelectric diaphragm when inputting a sinusoidal wave signal of 1 $V_{rms}$ between the metallic plate 12 and the front-surface electrode 11*a*, in the case of using a flat surface as a supporting surface (according to the conventional example) and in the case of using a curved surface as a supporting surface (according to preferred embodiments of the present invention).

The displacement is measured by a laser displacement meter. When the length and the width of the diaphragm are about 14.0 mm and about 10.0 mm, respectively, the two short surfaces of the diaphragm are fixed by a silicon adhesive with a total weight of about 2.0 mg, and the two long surfaces are not sealed. It is assumed that, according to preferred embodiments of the present invention, the radius of curvature r of the curved surface is about 0.3 mm, the coating width A of the adhesive is about 0.1 mm, and the clearance B is about 0.1 mm and, whereas, according to the conventional example, the coating width A of the adhesive is 0.3 mm.

As shown in FIG. 8, obviously, when supporting both ends of the piezoelectric diaphragm by the flat surface according to the conventional example, the displacement of the end portions of the piezoelectric diaphragm is restricted. Therefore, the maximum displacement at the center of the piezoelectric diaphragm is only approximately 27 μm. By contrast, when supporting both ends of the piezoelectric diaphragm by the curved surface (for example, r=0.3 mm) according to preferred embodiments of the present invention, the piezoelectric diaphragm 10 can be freely displaced downward, as shown by a broken line in FIG. 7, and the maximum displacement at the approximate center of the diaphragm 10 can be increased to approximately 35 μm. Consequently, it is understood that it is advantageous to set the curved surface as the supporting surface so as to realize a high sound pressure and a low frequency.

Figure 9:
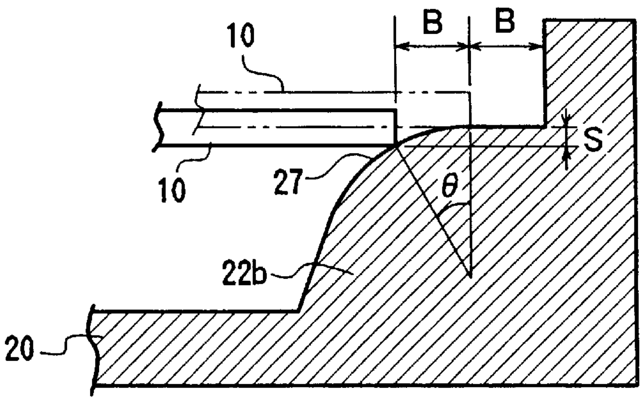
FIG. 9 is a cross-sectional view when a piezoelectric diaphragm according to preferred embodiments of the present invention is deviated in the lateral direction.

Since the clearance B is provided between the piezoelectric diaphragm 10 and the case 20 at both surfaces in the longitudinal direction, respectively, it is possible for the end portion of the piezoelectric diaphragm 10 to be placed halfway along the supporting surface 27, as shown in FIG. 9, if the piezoelectric diaphragm 10 is accommodated in the case 20 so as to deviate in one way along the length direction of the piezoelectric diaphragm 10. In this case, if r and B are equal to about 0.3 mm and about 0.1 mm, respectively, as an example, one end portion of the piezoelectric diaphragm 10 is positioned at a point lower than the original supported position (shown by a two-dot chain line) by a distance S. This lowered amount S is defined by the following equations.

$$\begin{aligned} S &= 0.3(1-\cos\theta) \\ &= 0.3\left[1-\sqrt{1-(0.1/0.3)^2}\right] \\ &= 0.017 \text{ mm} \end{aligned}$$

As indicated above, the lowered amount S is extremely small and, if the piezoelectric diaphragm 10 is held at a deviated point in the case 20, it is possible to prevent inclination of the piezoelectric diaphragm 10 by abutting the piezoelectric diaphragm 10 against the curved surface. As r becomes larger, the inclination becomes smaller because the lowered amount S also becomes smaller.

Figure 10:
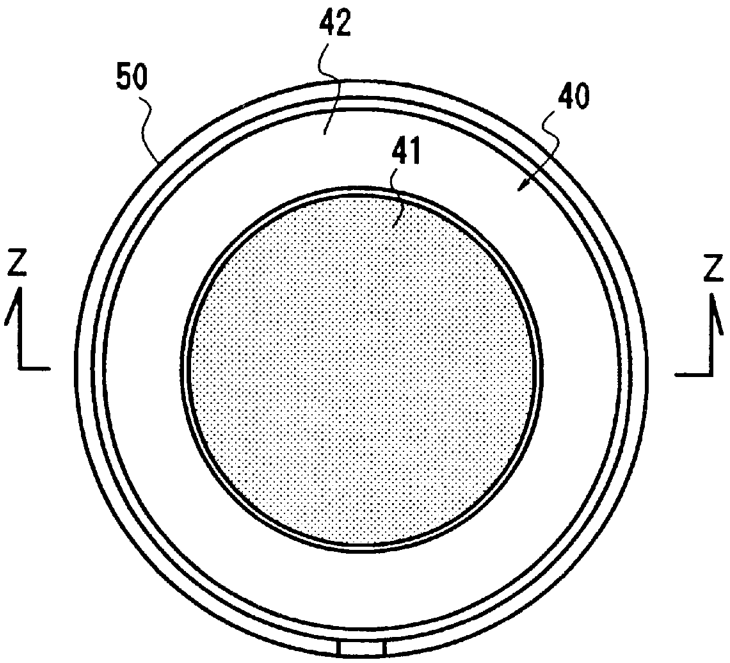
FIG. 10 is a plan view of a another preferred embodiment of the piezoelectric electro-acoustic transducer according to the present invention.
Figure 11:
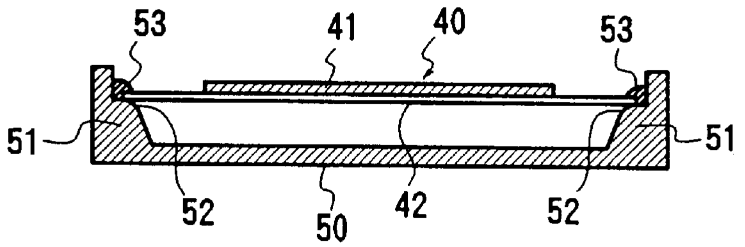
FIG. 11 is a cross-sectional view through a line XI—XI shown in FIG. 10.

FIGS. 10 and 11 show a second preferred embodiment of the piezoelectric electro-acoustic transducer according to the present invention using a substantially circular piezoelectric diaphragm.

A piezoelectric diaphragm 40 is preferably constructed by adhering a substantially circular piezoelectric ceramic plate 41 to the approximate center of the surface of a substantially circular metallic plate 42 that has a diameter larger than that of the piezoelectric ceramic plate 41. The peripheral portion of the metallic plate 42 is supported on a supporting portion 51 which is disposed at an inside peripheral portion of a case 50 and is fixed by an elastic adhesive 53 such as a silicon adhesive. A supporting surface 52 having a cross-section that is substantially arcuate, that is similar that of FIG. 7, is located at the supporting portion 51 of the case 50. This prevents the oscillation of the piezoelectric diaphragm 40 from being obstructed or hindered.

It is to be noted that a cover is adhered onto the opening of the case 50, although it is not shown in the figures.

Figure 12:
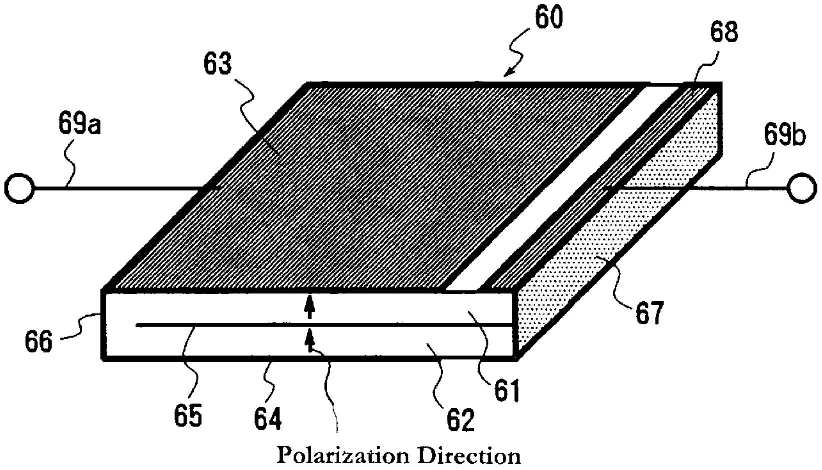
FIG. 12 is a perspective view of an additional preferred embodiment of a piezoelectric diaphragm for the piezoelectric electro-acoustic transducer according to the present invention.
Figure 13:
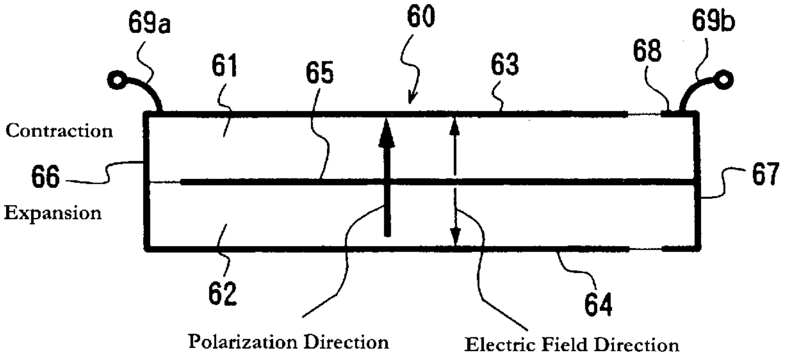
FIG. 13 is a cross-sectional view of the piezoelectric diaphragm shown in FIG. 12.

FIGS. 12 and 13 show another preferred embodiment of a piezoelectric diaphragm according to the present invention. A piezoelectric diaphragm 60 of this preferred embodiment can be replaced with the piezoelectric diaphragm 10 of the piezoelectric electro-acoustic transducer shown in FIGS. 4 to 7. The diaphragm 60 includes two piezoelectric ceramic layers 61 and 62 that are laminated. Main surface electrodes 63, 64 are provided on front and back surfaces of the diaphragm 60, respectively. An internal electrode 65 is provided between the ceramic layers 61, 62. Two ceramic layers 61 and 62 are polarized in the same direction along the thickness direction as shown by a thick arrow in FIG. 13.

In this preferred embodiment, the width of the main surface electrode 63 of the front surface and the main surface electrode 64 of the back surface is preferably the same dimension as the short surfaces of the diaphragm 60, and a little shorter than the long surfaces of the diaphragm 60. One end of each main surface electrode is connected to an end surface electrode 66 provided on an end surface of one short surface of the diaphragm 60. Thus, main surface electrodes of front and back surfaces are mutually connected. The internal electrode 65 is arranged to be a symmetrical shape relative to the main surface electrodes 63, 64. One end of the internal electrode 65 is separated from the end surface electrode 66 and the other end of the internal electrode 65 is connected to the end surface electrode 67 provided on an end surface of the other short surface of the diaphragm 60. An auxiliary thin electrode 68, which is conductively connected to the end surface electrode 67, is provided on upper and lower surfaces of the end portions of the other short surface of the diaphragm 60.

A lead line 69*a* is connected to the end surface electrode 66 or the main surface electrode 64 of the back surface. A lead line 69*b* is connected to the end surface electrode 67. Two short surfaces on which the end surface electrodes 66, 67 are provided are fixed to the supporting portions 22*a*, 22*b* of the casing 20 by an elastic adhesive. Spaces between two long surfaces and the casing 20 are sealed with an elastic sealing material. The diaphragm 60 is vibrated in a length bending mode by applying the predetermined alternating voltage between the lead lines 69*a* and 69*b*. The diaphragm 60 is vibrated in a bending mode by arranging each of both end portions of the short surfaces as a fulcrum, and arranging the approximate central portion in the longitudinal direction as a maximum amplitude point.

Since this piezoelectric diaphragm 60 of this preferred embodiment is substantially rectangular similar to the piezoelectric diaphragm 10 shown in FIGS. 4 to 7, the displacement volume is very large and the high acoustic convention efficiency is achieved, because the maximum amplitude point is provided along the central line of the longitudinal direction. Further, although the diaphragm 60 is fixed at both end portions in the longitudinal direction, the portions therebetween can be displaced freely because of the elastic sealing material, thereby achieving lower frequencies compared with the circular diaphragm. In other words, when the same frequency is obtained, the size of the diaphragm is miniaturized.

Further, since the piezoelectric diaphragm 60 has a configuration such that two piezoelectric ceramic layers 61, 62 polarized in the same direction are laminated, two ceramic layers 61, 62 oscillate in the opposite direction mutually, thereby producing a larger sound pressure as evidenced by the larger displacement compared with the unimorph piezoelectric diaphragm 10 shown in FIGS. 4 to 7.

Figure 14:
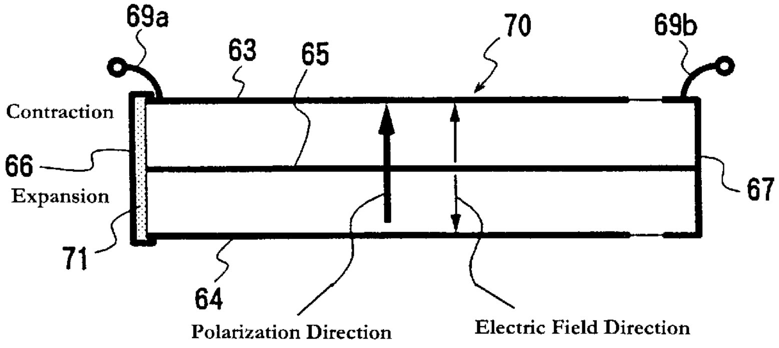
FIG. 14 is a cross-sectional view of an additional preferred embodiment of a piezoelectric diaphragm for the piezoelectric electro-acoustic transducer according to the present invention.

FIG. 14 shows a further preferred embodiment of a piezoelectric diaphragm according to the present invention.

The diaphragm 70 of this preferred embodiment has a similar configuration of the diaphragm 60 shown in FIGS. 12 and 13 basically, the same portions are referred to the same numerals and the repetitive explanation is omitted.

In FIGS. 12 and 13, an internal electrode 65 is a partial electrode. In FIG. 14, an internal electrode 65 is a whole electrode. In this case, since the internal electrode 65 is extended to the side of the end surface electrode 66, there might be a possibility that the internal electrode 65 is conductive connected to the end surface electrode 66. In order to prevent that, an insulating layer 71 is provided on an end surface of the diaphragm 70, and an end surface electrode 66, which electrically connects the main surface electrodes 63, 64 on front and back surfaces, is provided. As a result of this arrangement, although the internal electrode 65 is a whole electrode, the internal electrode 65 is insulated from the main surface electrodes 63 and 64 securely.

Figure 15:
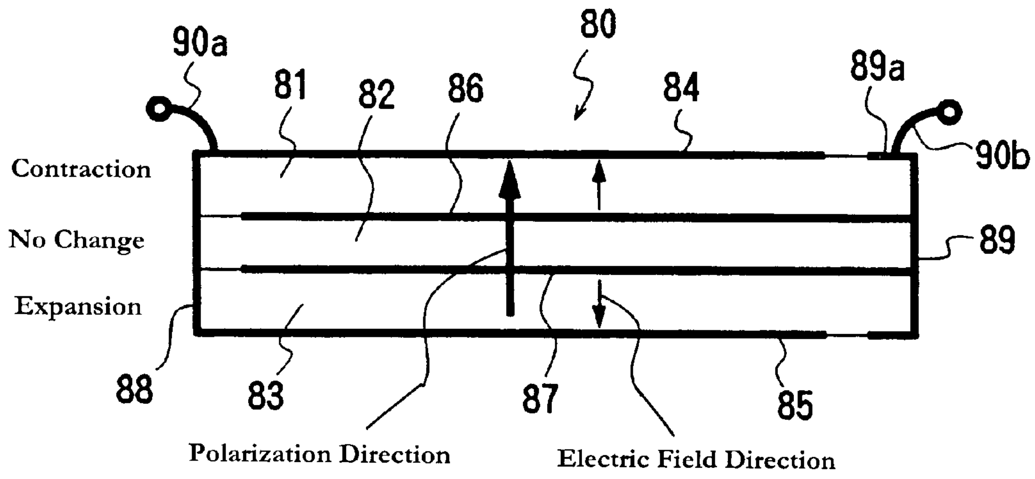
FIG. 15 is a cross-sectional view of a further preferred embodiment of a piezoelectric diaphragm for the piezoelectric electro-acoustic transducer according to the present invention.

FIG. 15 shows another preferred embodiment of a piezoelectric diaphragm according to the present invention.

A diaphragm 80 of this preferred embodiment includes three piezoelectric ceramic layers 81 to 83 which are laminated. Main surface electrodes 84, 85 are provided on front and back surfaces of the diaphragm 80. Internal electrodes 86, 87 are disposed between respective ceramic layers 81 to 83. Three ceramic layers 81 to 83 are polarized in the same direction along the thickness direction as shown by the thick arrow.

In this preferred embodiment, the width of the main surface electrodes 84, 85 is preferably substantially the same as the short surface of the diaphragm 80 and a little shorter than the long surface of the diaphragm 80. Therefore, main surface electrodes 84, 85 are connected mutually. Each end of the internal electrodes 86, 87 is separated from the end surface electrode 88. The other ends of the internal electrodes 86, 87 are connected to the end surface electrode 89 disposed on the end surface of the other short surface of the diaphragm 80. Thus, the internal electrodes 86, 87 are mutually connected. An auxiliary thin-width electrode 89*a* that is conductive connected to the end surface electrode 89 is provided on upper and lower surfaces of end portions of the other short surface of the diaphragm 80.

The electric field that extends in a direction shown in a thin arrow of FIG. 15 is generated when the lead lines 90*a*, 90*b* are connected to the end surface electrodes 88, 89, respectively, the negative voltage is applied to the lead line 90*a*, and the positive voltage is applied to the lead line 90*b*. At this time, since the internal electrodes 86, 87, located at both surfaces of the ceramic layer 82 functioning as an intermediate layer, have the same potential, and no electric field is generated. The ceramic layer 81 of the front surface contracts in the planar surface direction, because the polarization direction is the same as the electric field direction. The ceramic layer 82 of the back surface expands in the planar surface direction, because the polarization direction is opposite to the electric field direction. The intermediate layer 82 does not contract or expand. As a result, the diaphragm bends so as to project downward. When the alternating voltage is applied between the end surface electrodes 88, 89, the diaphragm 80 generates bending oscillation periodically. Thus, very large sound is generated.

In FIG. 15, the internal electrodes 86, 87 are preferably partial electrodes, however, they may be whole electrodes as shown in FIG. 14.

The present invention is not limited to the foregoing preferred embodiments, and can be modified variously without departing from the present invention.

The structure of the casing is not limited to the structure defined by the concave case and the cover as illustrated in the preferred embodiments, and the casing may also be constructed by covering a flat plate substrate with a cap. In this case, a supporting portion having a cross-section that is arcuate may be provided at an inside surface of the cap and the peripheral portion of the piezoelectric diaphragm may be attached to the supporting portion.

Lead out elements for leading out the electrodes of the piezoelectric diaphragm to the outside are not limited to the lead wires as illustrated in the preferred embodiments, and it is also sufficient to form a terminal and an electrode for external connection to a case or substrate and then to connect an electrode of the piezoelectric diaphragm to the terminal and the electrode for external connection by utilizing a conductive adhesive or other suitable material.

Although the piezoelectric ceramic plate is adhered to one surface of the metallic plate and the unimorph diaphragm is thus constructed in some of the preferred embodiments of the present invention, a bimorph diaphragm may be constructed by adhering a piezoelectric ceramic plate to both surfaces of the metallic plate, within the scope of the present invention.

Incidentally, the piezoelectric electro-acoustic transducer of the present invention can be utilized as a sound receiver such as a piezoelectric receiver in addition to the application as a sound generator such as a piezoelectric buzzer, a piezoelectric sounder, and a piezoelectric speaker, or other suitable applications.

As described above, according to various preferred embodiments of the present invention, the support portion for supporting the peripheral portion of the piezoelectric diaphragm is provided in the casing, the supporting surface with an arcuate cross-section is located at the supporting portion so that a center of curvature of the supporting surface is positioned near the lower surface of the peripheral portion of the piezoelectric diaphragm, and the peripheral portion of the piezoelectric diaphragm is fixed onto the supporting surface by the elastic adhesive. Therefore, an angular change of the peripheral portion of the piezoelectric diaphragm is not restricted, the effective oscillation area of the piezoelectric diaphragm is also much larger than that of supporting the piezoelectric diaphragm by a conventional flat supporting surface, and further, the realization of a low frequency is possible.

When setting the piezoelectric diaphragm to the supporting portion of the casing, the peripheral portion of the piezoelectric diaphragm is placed onto the arcuate supporting surface if the piezoelectric diaphragm deviates slightly in the lateral direction, thereby making it possible to control the oblique arrangement of the piezoelectric diaphragm.

Moreover, if the piezoelectric diaphragm is fixed to the supporting portion of the casing, the peripheral portion of the piezoelectric diaphragm may be set on the supporting portion and the surface may be coated with the elastic adhesive, thus simplifying the adhering.

It should be understood that the foregoing description is only illustrative of the present invention. Various alternatives and modifications can be devised by those skilled in the art without departing from the invention. Accordingly, the present invention is intended to embrace all such alternatives, modifications and variances which fall within the scope of the appended claims.

What is claimed is:

1. A piezoelectric electro-acoustic transducer comprising:

a piezoelectric diaphragm including a piezoelectric ceramic plate having electrodes provided on front and back surfaces thereof, and a metallic plate onto which the piezoelectric ceramic plate is mounted; and a casing accommodating said piezoelectric diaphragm, said casing including a support portion arranged to contact and support substantially the entire peripheral portion of said piezoelectric diaphragm such that the peripheral portion thereof is fixed to the support portion, said support portion including a supporting surface, said supporting surface having an arcuate cross-section and a center of curvature of said supporting surface being positioned near a lower surface of the peripheral portion of said piezoelectric diaphragm.

2. A piezoelectric electro-acoustic transducer according to claim 1, further comprising an elastic adhesive arranged to fix the peripheral portion of the piezoelectric diaphragm to the support portion.

3. A piezoelectric electro-acoustic transducer according to claim 1, wherein the radius of curvature of said arcuate supporting surface is smaller than one of a longer surface and a diameter of said piezoelectric diaphragm.

4. A piezoelectric electro-acoustic transducer according to claim 1, wherein the piezoelectric diaphragm includes a piezoelectric ceramic plate, an electrode provided on front and back surfaces of the piezoelectric ceramic plate and a metallic plate fixed to the electrode on one surface of the piezoelectric ceramic plate.

5. A piezoelectric electro-acoustic transducer according to claim 4, wherein the piezoelectric diaphragm vibrates in a bending mode as a whole in response to application of an alternating signal applied between the other electrode on the piezoelectric ceramic plate and the metallic plate.

6. A transducer according to claim 4, wherein said piezoelectric diaphragm is defined by a substantially rectangular piezoelectric ceramic plate joined to a substantially rectangular metallic plate, the two short surfaces of said substantially rectangular metallic plate are attached to the supporting portion of the casing by the elastic adhesive, and spaces between two long surfaces of said substantially rectangular metallic plate and the casing are sealed by an elastic sealing material.

7. A piezoelectric electro-acoustic transducer according to claim 1, wherein the piezoelectric plate includes a laminated body in which at least two piezoelectric ceramic layers are laminated, main surface electrodes provided on front and back surfaces of the laminated body, internal electrodes located between each of the ceramic layers, wherein all of the ceramic layers are polarized in the same direction along the thickness direction, and the laminated body vibrates in a bending mode as a whole in response to application of an alternating signal applied between the main surface electrodes and the internal electrodes.

8. A piezoelectric electro-acoustic transducer according to claim 7, wherein said laminated body is substantially rectangular, two of the short surfaces of the laminated body are attached to the supporting portions of the casing, and spaces between the two long surfaces of the laminated body and the casing are sealed by an elastic sealing material.

9. A piezoelectric electro-acoustic transducer according to claim 1, wherein the piezoelectric diaphragm has a unimorph construction.

10. A piezoelectric electro-acoustic transducer according to claim 1, wherein the piezoelectric diaphragm has a bimorph construction.

11. A piezoelectric electro-acoustic transducer according to claim 1, wherein the piezoelectric ceramic plate and the metallic plate of the piezoelectric diaphragm are substantially rectangular and have substantially the same width.

12. A piezoelectric electro-acoustic transducer according to claim 11, wherein the length of the metallic plate is longer than that of the piezoelectric ceramic plate and is electrically connected to the back-surface electrode of the piezoelectric plate.

13. A piezoelectric electro-acoustic transducer according to claim 1, wherein the Young's modulus of the metallic plate is substantially the same as that of the piezoelectric plate.

14. A piezoelectric electro-acoustic transducer according to claim 1, wherein the piezoelectric ceramic plate is fixed to a first surface of the metallic plate such that at least one edge of said piezoelectric ceramic plate is spaced from a corresponding edge of the metallic plate, and the metallic plate has an exposed portion at a second surface of the metallic plate.

15. A piezoelectric electro-acoustic transducer according to claim 1, wherein the metallic plate and the piezoelectric plate are substantially circular.

16. A piezoelectric electro-acoustic transducer according to claim 15, wherein the piezoelectric plate is fixed at the approximate center of the substantially circular metallic plate.

17. A piezoelectric electro-acoustic transducer according to claim 15, wherein the metallic plate has a larger diameter than that of the piezoelectric ceramic plate.

18. A piezoelectric electro-acoustic transducer according to claim 1, wherein the piezoelectric diaphragm vibrates in a longitudinal bending mode.

19. A piezoelectric electro-acoustic transducer according to claim 1, wherein the casing includes a concave case having an opening and a cover arranged to cover the opening in the concave case.

* * * * *